United States Patent [19]

Suzuki

[11] 4,391,899
[45] Jul. 5, 1983

[54] METHOD OF MAKING A HALF-TONE GRAVURE PRINTING PLATE

[75] Inventor: Teruo Suzuki, Ageo, Japan

[73] Assignee: Toppan Printing Co., Ltd., Japan

[21] Appl. No.: 296,197

[22] Filed: Aug. 25, 1981

[30] Foreign Application Priority Data

Aug. 28, 1980 [JP] Japan .................. 55-118712

[51] Int. Cl.³ .............................. G03C 5/00
[52] U.S. Cl. ................... 430/307; 430/300; 430/306
[58] Field of Search ............. 430/300, 306, 307

[56] References Cited

U.S. PATENT DOCUMENTS 4,012,257 3/1977 Geris .................. 430/307

FOREIGN PATENT DOCUMENTS 50-26603 3/1975 Japan .
55-28044 2/1980 Japan .

Primary Examiner—Jack P. Brammer
Attorney, Agent, or Firm—Lerner, David, Littenberg, Krumholz & Mentlik

[57] ABSTRACT

An improved method of making a half-tone gravure printing plate in which a planographic or relief half-tone positive and a gravure screen are printed on a photosensitive resist forming material. In the method, the lowering of the quality of printed matter resulting from formation of moire pattern can be prevented and an error caused by the reproduction step between a new half-tone positive and an original half-tone positive can be corrected. The method comprises the steps of contacting and inverting the planographic or relief half-tone positive on a soft continuous gradation film to prepare a half-tone negative, screening in a photosensitive film with screen dots of the half-tone negative eliminated by use of a contact screen to prepare a new half-tone positive; printing the new half-tone positive on a photosensitive resist forming material to form an element of sizes of dots; and forming a space between the new half-tone positive and the photosensitive resist forming material, and printing said half-tone positive, blurring the screen dots, on the photosensitive resist forming material, thereby correcting an error of gradation of a middle tone portion.

2 Claims, 8 Drawing Figures

METHOD OF MAKING A HALF-TONE GRAVURE PRINTING PLATE

BACKGROUND OF THE INVENTION

1. Field of the Invention

The present invention relates to a method of making a half-tone gravure plate, and more particularly to a method of making a gravure printing plate in which a planographic or relief half-tone positive and a gravure screen are printed on a photosensitive resist forming material.

2. Description of the Prior Art

In the past, a method is well known and extensively embodied as can be seen in Japanese Patent Application Laid-open No. 50-26603 which comprises printing a planographic or relief half-tone positive and a gravure screen on a photosensitive resist forming material, thereafter subjecting said photosensitive resist forming material to development and other processes to form a resist, and etching a gravure printing plate material through said resist to obtain a gravure printing plate.

In such a method, a moire pattern is sometimes formed depending on a combination of a screen angle of the half-tone positive and a screen angle of the gravure screen to lower the quality of images. Accordingly, in such a case, it is necessary to combine the screen angles of the half-tone positive and gravure screen with an angle to make the moire imperceptible in order that the moire pattern is made imperceptible. Such an angle may be obtained by the relative rotation of the half-tone positive or the gravure screen.

On the other hand, in the step of making a gravure printing plate, positive designs for several pages (for example, four pages) are often formed on a single cylinder at the same time, in which case, a sheet of large gravure screen is printed in contact with a sheet of large photosensitive resist forming material, and a half-tone positive for several pages is printed on the same photosensitive resist forming material to prepare a resist. In such a case, if the screen angles of all half-tone positives are the same, no problem arises but if a screen angle of one half-tone positive for any of pages is different from that of the other half-tone positive, a problem arises.

That is, if the screen angle of the half-tone positive for any of pages is made to minimize the moire pattern, other half-tone positives do include one which has a screen angle at which the moire pattern is formed. Such a problem is not only involved in the case that the screen angle is different at page unit but in the case that a design having different screen angles is present even in one page.

Furthermore, if the number of screen lines (screen ruling) of the half-tone positive is different from the number of screen lines (screen ruling) of the gravure screen, the angle at which the moire is minimized is different.

Thus, in the case that the number of screen lines of the half-tone positive is different at page unit, or also in the case that the number of screen lines of any design in the half-tone positive for one page portion is different, there occurs a problem in the formation of moire pattern between the half-tone positive and the gravure screen similarly to the foregoing.

Also, it is sometimes necessary to print a design previously printed by the planographic printing system, by the gravure printing system at a different magnification. In this case, the half-tone positive used in the planographic printing can be enlarged or reduced as it is to make a half-tone positive having the desired magnification, but if the magnification of enlargement is different with the page unit or design, the number of screen lines of the half-tone positive becomes varied according to the magnification of enlargement, which leads to the problem of formation of the moire pattern between the half-tone positive and the gravure screen as previously described.

Accordingly, if any inconvenience occurs because of irregularities in the screen angle, the number of screen lines, the magnification of enlargement, etc. of the half-tone positive as described above, it is apparent that all that need be done is to arrange them so that they may have the same value.

Incidentally, a method is disclosed in Japanese Patent Application Laid-open No. 55-28044 which can vary at least one of the screen angle, the number of screen lines, the shape of dots and the enlargement ratio of the half-tone positive to prepare another half-tone positive. The aforesaid patent application discloses a method in which a half-tone positive as an original is exposed to a photosensitive material having a contact screen held in contact therewith at the desired magnification with the diaphragm value of a lens of a plate making camera set to more than 64, preferably, from 64 to 128, to thereby prepare a new half-tone positive having the desired screen angle, the screen ruling, shape of dots and enlargement ratio. According to the method disclosed in the aforesaid patent application, in the case that the conversion is accomplished between the half-tone positives at an angle at which the moire is relatively imperceptible so as to assume 30 degrees which is a difference in the screen angle between the original half-tone positive and the new half-tone positive, the moire is imperceptible even if the dots of the original half-tone positive remain without being completely eliminated, and therefore, this method is effective to some extent.

However, in case of the present invention, it is necessary to convert the half-tone positive for some pages out of the half-tone positive for several pages into the screen angle of the half-tone positive for other pages or to convert some designs in one page into the screen angle of other designs, in which case, the difference in screen angle between the original half-tone positive and the new half-tone positive is not always 30° at which the moire pattern is imperceptible but is sometimes 5° or 10°.

The present inventor has found that in such a case as described above, when the diaphragm value of the lens as disclosed in the aforementioned Japanese Patent Application Laid-Open No. 55-28044 is set from about 64 to about 128, the moire pattern is still perceptible to lower the quality of printed matter. As the result, the present inventor provides a new method of making a gravure printing plate, which method comprises preparing a new half-tone positive by a totally separate method and using said new half-tone positive to obtain a gravure printing plate whereby the lowering of the quality of printed matter resulting from the formation of moire pattern can be prevented and an error of graduation caused by the reproduction step between the new half-tone positive and the original half-tone positive can be corrected.

BRIEF DESCRIPTION OF THE DRAWINGS

The present invention will be more fully understood by referring to the following detailed description in connection with the accompanying drawing, in which.

FIG. is a graphic representation showing the relationship between a half-tone positive converted in screen after inversion into a lith film.

DETAILED DESCRIPTION OF THE INVENTION

Generally, the resolving power of a lens is, in consideration of black and white lines of equal width, represented by the number of black or white lines within 1 mm that can be judged as the lines on the image surface, and the resolving power ($R_L$) of an ideal lens on the optical axis is given by $$R_L = \frac{1}{1.22 \lambda F (1 + m)} \quad (1)$$

where $\lambda$ is the wavelength of photographing light, F is the F number of lens, and m is the photographing magnification. The greater the value F the resolving power $R_L$ will be poor. The dimension l between the lines that become difficult to recognize is given by $$l = \frac{1}{2 R_L} \quad (2)$$

This formula is used to calculate a necessary dimension which cannot be judged from the number of screen lines of the original half-tone positive or half-tone negative and obtain the resolving power $R_L$, and the value F is obtained from the formula (1). The diaphragm of said value is used to carry out photographing, to obtain the conditions under which the screen dots are eliminated and the resolving power can be obtained.

For example, in the case that the dots are formed by screen lines of 150 l/inch, when photographing is effected at a full size, the screen dots are eliminated in such a manner that lines of about 120 μ are not resolved. In the reduction photographing at 2/3, the screen dots are eliminated in such a manner that lines of about 80 μ are not resolved. When the $R_L$ is obtained from the formula (2), about 4.2 l/mm at the full size results and about 6.3 l/mm at 2/3 results. If this value is introduced into the formula (1) to obtain the value F, 179 at the full size results and 143 at 2/3 results, and thus, the diaphragm of the lens may well be diaphragmed to said value for photographing.

Figure 1:
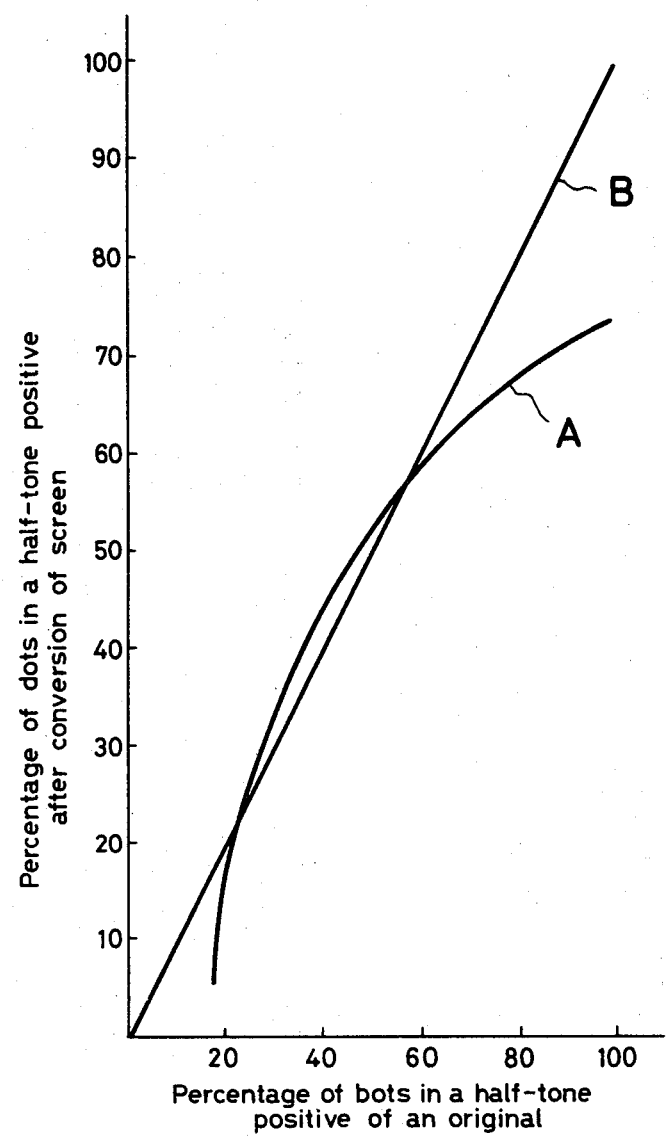

However, in the case that the original half-tone positive (or half-tone negative) is contact-inverted on the lith film to form a half-tone negative (or half-tone positive), and that thus inverted half-tone negative (or half-tone positive) is used as an original and the diaphragm of the lens is diaphragmed to get the aforesaid value F and then carrying out the screening by using the contact screen to obtain a new half-tone positive (or half-tone negative) after screen dots of the original half-tone positive have been converted, it was found that the curve (A) of FIG. 1 was obtained.

That is, ideally, the curve should be the straight line as shown in the curve (B) of FIG. 1, but the result was the half-tone positive lacking a shadow portion and a light portion. Good printed matter cannot be produced by use of such a half-tone positive as described.

To cover the shortage of screen dots in the shadow portion and in the light portion as described above, it is possible to perform auxiliary exposures such as a shadow exposure or a light exposure. However, the determination of exposure amount in the auxiliary exposure is complicated and even if the exposure amount is slightly deviated, the size of dots is greatly deviated and as the result, extremely large irregularities are liable to occur and stabilized plate making cannot be expected. In addition, the auxiliary exposure exerts an influence on not only the shadow portion and the light portion but also on the middle tone portion, and as a whole, it is not possible to obtain a reproduced half-tone positive (or half-tone negative) faithful to the original half-tone positive (or half-tone negative).

The present inventor has made various studies in order to solve these problems noted above and found the following fact an original of a lith film having dots is once inverted on a soft continuous gradation film such as a film used for the gravure process, the range of density thereof is controlled by adjusting the exposure amount and developing time, a half-tone negative or a half-tone positive inverted on the soft film is used as an original, a diaphragm of a lens of the camera is diaphragmed so as to eliminate screen dots of said original and a contact screen is applied thereto, and screening process is carried out using a photosensitive film such as a lith type film and a contact screen to be able to eventually obtain a totally new half-tone positive or a half-tone negative provided with new screen dots.

Figure 2:
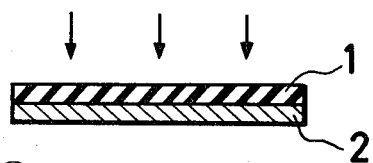
FIGS. 2 to 5 are respectively explanatory views showing a flow of the method for conversion of the half-tone positive in accordance with the present invention.
Figure 3:
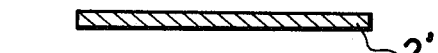
Figure 4:
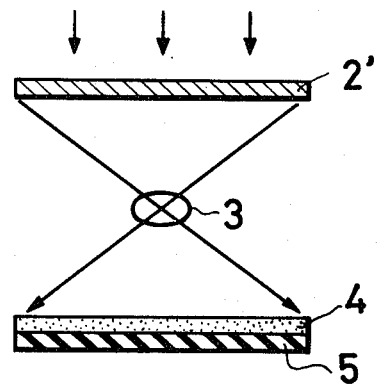

One embodiment of the present invention will be further described in detail with reference to the drawings. Referring first to FIG. 2, an original half-tone positive 1 is placed on a soft continuous gradation film 2 in contact therewith and exposed to a light source from the direction as indicated by the arrows. This is then subjected to development to obtain an inverted half-tone negative 2' as shown in FIG. 3. Next, as shown in FIG. 4, the thus contacted and inverted half-tone negative 2' is used as an original, and a contact screen 4 is placed on a lithographic film 5 to provide screen data. In this case, the screen angle of the contact screen 4, the screen ruling, the shape of dots and the like can be suitably selected as desired for use.

In this screening step, after a lens 3 of the camera has been focused, a diaphragm (not shown) is diaphragmed till the dots of the screen original are eliminated and then carried out the screening exposure. That is, the above-described formulae (1) and (2) are utilized to carry out the screening process at the diaphragm of value F at which screen dots of the half-tone negative are eliminated or at the diaphragm of value F greater than the first-mentioned value.

Figure 5:

This is then subjected to development to obtain a new half-tone positive 5' as shown in FIG. 5.

Figure 6:
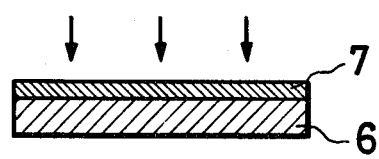
FIGS. 6 to 8 are respectively explanatory views of the printing steps onto the carbon tissue, FIG. 6 being the printing of the gravure screen, FIG. 7 being the contactprinting of the half-tone positive, and FIG. 8 being the printing with a space disposed.

The thus obtained new half-tone positive 5' has the gradation similar to that of the original half-tone positive 1. However, it has been found as the result of further detailed studies made by the inventor that the aforesaid new half-tone positive 5' tends to have more middle tone portion than the original half-tone positive 1, that is, tends to have a larger area of dots in the middle tone portion. This trend becomes conspicuous as the value F increases. In case that such a new half-tone positive 5' is used to make a gravure printing plate, it is necessary to correct an error in the middle tone portion with respect to the original half-tone positive 1. The inventor has found that said correction of error can be made when the new half-tone positive is printed on a photosensitive resist forming material in the following manner. In the present invention, as shown in FIG. 6, a gravure screen 7 is held in contact with a photosensitive resist forming material 6 and exposed to a light from the direction as indicated by the arrows to print the gravure screen 7 on the photosensitive resist forming material 6. The gravure screen 7 can be suitably selected for use as long as it is used to form a cell which forms an ink receiving portion in the gravure printing plate. The most commonest gravure screen used includes white line screens for gravure, contact screen for gravure, and the like.

Figure 7:
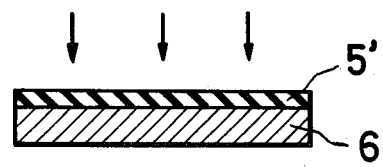

The new half-tone positive 5' obtained as described above is further held in contact with the photosensitive resist forming material 6 with the gravure screen printed thereon and exposed to a light from the direction as indicated by the arrows, as shown in FIG. 7, to print the half-tone positive 5' on the resist forming material 6. Thereby, the shape of dots of the new half-tone positive 5' is formed in the photosensitive resist forming material 6 to form an element of sizes of screen dots. As already described, when this shape of screen dots is compared with the shape of screen dots in the original half-tone positive 1, the middle tone portion tends to increase. Accordingly, the element of sizes of screen dots formed by the new half-tone positive 5' as described above becomes increased in the middle tone portion.

Figure 8:
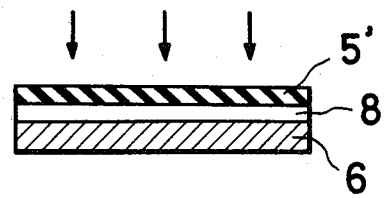

Furthermore, in the present invention, a space 8 is formed between the photosensitive resist forming material 6 and the new half-tone positive 5', which are registered, and exposed to a light from the direction as indicated by the arrows to print the new half-tone positive 5' on the photosensitive resist forming material 6 with the screen dots of the half-tone positive 5' vignetted, as shown in FIG. 8. To provide the space 8, one which is transparent such as a transparent film, a matted film or a light diffusion sheet such as a frosted glass may be used. In case that a transparent one is used, if the diffusion light is used to expose the half-tone positive, the diffusion effect is advantageously increased. In case that the planographic or relief half-tone positive is used, the correction of the middle tone portion is rendered possible by the printing with said space disposed.

That is, it is possible to correct an increase in the printing density of the middle tone portion resulting from an increase in the area of screen dots of the middle tone portion in the new half-tone positive 5'.

The printing with the space disposed in the present invention causes to perform the correction of an error in the middle tone portion of the new half-tone positive, and in addition, a printing with the space may have a difference formed in depths of the ink receiving cell. This printing for forming the difference in depths can be carried out similarly to the printing for the correction of the middle tone portion.

The aforementioned various printings of the half-tone positive on the photosensitive resist forming material can be achieved in any suitable order. Upon completion of the printing, the photosensitive resist forming material is subjected to the steps of development, transferring thereof onto a gravure plate member such as a gravure cylinder, or the like before formation of the resist onto the gravure plate member, and etched by an etching solution through said resist to obtain a gravure printing plate, which is likewise accomplished in the conventional method.

In accordance with the present invention, there is provided a new method which, in case that a planographic or relief half-tone positive and a gravure screen are used to obtain a gravure printing plate, can convert an unusable half-tone positive which cannot be used because the screen angle, magnification or the like are different into a usable half-tone positive, and in addition, in the present invention, even an error formed in connection with the original half-tone positive resulting from said conversion may be corrected, the formation of moire pattern can be prevented and gravure printed matter of proper gradation may be obtained.

Examples of the present invenption are given in the following.

EXAMPLE 1

An offset half-tone positive of 150 l/inch as an original was held in contact with SAKURA SG-100E film and exposed to a light source by a printer at a voltage of 35 V for 8 seconds and subjected to development at 24 inches/minute to obtain a half-tone negative. A conventional contact screen of 150 l/min. was applied at a diaphragm of 152 using the thus obtained half-tone negative to achieve the half-tone taking at a magnification of $\frac{2}{3}$, as a consequence of which a half-tone positive having the magnification of $\frac{2}{3}$ was obtained with the number of screen lines of 150 l/inch.

Separately, a gravure screen of 250 l/inch was held in contact with a carbon tissue and exposed to a light source which is a mercury lamp for three minutes and 20 seconds. Subsequently, the aforesaid half-tone positive obtained by conversion as described above was held in contact with the same carbon tissue and exposed to the aforesaid light source for two minutes and 30 seconds. Further, a matted film of 100$\mu$ thick is inserted between said half-tone positive obtained by the conversion as described above and the carbon tissue and they were held in contact with each other and thereafter exposed to the aforesaid light source for 60 seconds.

The carbon tissue subjected to the exposure of light three times as described above was transferred on a cylinder for gravure plate, subjected to development with hot water to form a resist, and subjected to etching with a ferric chloride solution to obtain a gravure printing plate.

The printed matter obtained by the aforementioned gravure printing plate involved no formation of moire pattern and was found to have a favorable value of density in the middle tone portion.

EXAMPLE 2

An offset half-tone positive for one page portion of 150 l/inch and screen angle 10 degrees was used as an original to obtain a half-tone negative likewise the Example 1. Said half-tone negative was used and the conventional contact screen of diagphragm 200 and 150 l/inch was used to achieve the half-tone taking at full size at the screen angle of 15 degrees in order to obtain a new half-tone positive. This half-tone positive together with a separate half-tone positive for three pages of screen angle 15 degrees and 150 l/inch was held in contact with a carbon tissue on which a gravure screen of 250 l/inch in the number of screen lines has been printed at the screen angle of 45 degrees and exposed to the light source of Example 1 for three minutes and 20 seconds. Next, a matted film similar to that used in Example 1 is inserted between a new half-tone positive and a carbon tissue and a mask such that only the new half-tone positive portion is exposed to the light is placed thereon and exposed to the similar light source for 30 seconds, after which only the mask is removed and the whole portion was exposed to a light source for 30 seconds. The carbon tissue thus exposed to the light was used to accomplish development, transferring and etching in a manner similar to Example 1 in order to obtain a gravure printing plate.

The printed matter obtained by the gravure printing plate obtained as described above involved no formation of moire pattern and was found to have a proper value of density in the middle tone portion.

What is claimed is:

1. A method of making a gravure printing plate by using a planographic or relief half-tone positive comprising the steps of:

contacting said half-tone positive on a photosensitive film of low contrast, projecting light on said photosensitive film and thereafter effecting development thereof to thereby make a half-tone negative which is inverted relative to said half-tone positive;

contacting a contact screen on a lith-type photosensitive film with said negative being used as an original;

forming an image of said half-tone negative on said lith-type photosensitive film with a camera, the F number of the diaphragm of the lens of said camera being selected to make it impossible to resolve the dots of said half-tone negative at a resolving power ($R_L$) represented by $$R_L = \frac{1}{1.22 \lambda F (1 + m)}$$

(where $R_L$ is the resolving power of the lens, $\lambda$ is the wavelength of photographing light, F is the F number of the diaphragm of the lens of said camera, and m is the photographing magnification) thereby producing an image formed on said lith-type photosensitive film which is different in at least one respect as to the shape of at least one dot, the number of screen lines of said contact screen or a screen angle in comparison with that of said original half-tone positive;

developing said lith-type photosensitive film to make a new planographic or relief half-tone positive which is different in at least one respect as to the number of screen lines, the screen angle, the magnification and the shape of at least one dot in comparison with said original half-tone positive;

effecting the following steps:

exposing said half-tone positive from said lith-type photosensitive film to light in contact with a photosensitive resist forming material, correcting an error in gradation of a middle tone portion between said new half-tone positive and said original half-tone positive by means of exposing said photosensitive resist forming material to the light so that the dots of said half-tone positive may be blurred by forming a spacing between said new half-tone positive and said photosensitive resist forming material, and exposing a gravure screen to light in contact with said photosensitive resist forming material; and etching a gravure cylinder through said resist on said cylinder.

2. The method of making a half-tone gravure plate as claimed in claim 1, wherein a light diffusion sheet is used in said space formed between said new half-tone positive and said photosensitive resist forming material.

* * * * *